United States Patent
Rose et al.

(10) Patent No.: US 8,482,917 B2
(45) Date of Patent: Jul. 9, 2013

(54) NETWORK SWITCH COOLING SYSTEM

(75) Inventors: Alexander E. Rose, Santa Clara, CA (US); Aleksandr Oysgelt, Newark, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 12/291,170

(22) Filed: Nov. 5, 2008

(65) Prior Publication Data

US 2010/0110632 A1 May 6, 2010

(51) Int. Cl.
*H05K 5/00* (2006.01)
*H05K 7/00* (2006.01)
*H05K 7/20* (2006.01)

(52) U.S. Cl.
USPC ...................... 361/695; 361/679.48

(58) Field of Classification Search
USPC .................. 361/170, 695, 724–727
See application file for complete search history.

(56) References Cited

U.S. PATENT DOCUMENTS

| | | | |
|---|---|---|---|
| 5,168,424 A | 12/1992 | Bolton | |
| 5,875,965 A * | 3/1999 | Lee | 236/44 C |
| 6,272,012 B1 * | 8/2001 | Medin et al. | 361/690 |
| 6,459,589 B2 * | 10/2002 | Manweiler et al. | 361/752 |
| 6,512,672 B1 | 1/2003 | Chen | |
| 6,592,327 B2 | 7/2003 | Chen | |
| 6,604,916 B2 | 8/2003 | Lu | |
| 7,259,961 B2 | 8/2007 | Lucero | |
| 7,372,695 B2 | 5/2008 | Coglitore | |
| 2004/0228090 A1 * | 11/2004 | Blackwell | 361/695 |
| 2008/0259555 A1 * | 10/2008 | Bechtolsheim et al. | 361/686 |

OTHER PUBLICATIONS

"SBS Makes InfiniBand™ Switch Practical and Affordable by Delivering Flexible Configuration and High Availability" SBS Technologies press release. <<http://www.infinibandta.org/data/press/mem_releases/2002_10_21.pdf>>, Oct. 21, 2002.

* cited by examiner

*Primary Examiner* — Zachary M Pape
*Assistant Examiner* — Jerry Wu
(74) *Attorney, Agent, or Firm* — Wilson Sonsini Goodrich & Rosati

(57) ABSTRACT

A high-performance network switch chassis has multiple network ports and air openings on the front end of the chassis, and multiple fan modules mounted on the back end of the chassis. The fan modules are hot-swap replaceable so that replacement of one of the fan modules does not require interruption of network switch operation. Air-blockers associated with each fan module prevent recirculation of air when fan modules are removed. Different types of fan modules may be used to provide either front-to-rear or rear-to-front airflow through the chassis. A fan speed controller determines fan speed based on temperature using one of two profiles. The two profiles correspond to the two different airflow directions.

8 Claims, 4 Drawing Sheets

NETWORK SWITCH COOLING SYSTEM

FIELD OF THE INVENTION

The present invention relates generally to network switch chassis designs. More specifically, it relates to cooling systems for a network switch chassis.

BACKGROUND OF THE INVENTION

Network switches are commonly enclosed within a chassis for support, physical security and efficient usage of space. The electronic components contained within the chassis generate a significant amount of heat. Thermal damage may occur to the electronic components unless the heat is removed properly.

Proper removal of the heat requires fans that draw low temperature air into the switch chassis from one side and push out the heated air on another side of the chassis. What is important for proper cooling is that cool air is available from the environment and that there is no re-circulation of heated air back into the chassis since this could result in less effective heat transfer and could cause the switch to overheat and potentially sustain thermal damage.

Network switches are typically installed in standard data center equipment racks, also known as 19" racks. Historically most network switches were mounted with their switch ports facing to the front of the rack and have used side-to-side air cooling, where fans move air across the width of the switch, orthogonal to the plane of the switch ports, or have used side-to-rear air cooling, where air is drawn into the chassis from one or both sides of the chassis and pushed out to the rear of the chassis.

The conventional side-to-side or side-to-rear airflow design for network switches poses significant problems when deploying high performance networking switches in conjunction with rack-mounted servers or storage units that use front-to-back cooling, where air flows from the front of the chassis to the rear of the chassis. Using side-to-side or side-to-rear airflow network switches in the same rack as front-to-rear airflow servers creates hot air recirculation and potential overheating for the networking switch. In addition, server equipment racks are typically enclosed on the left and right side, leaving very little room inside the rack to supply cool air and remove heated air for switches that use side-by-side airflow cooling. Finally, server equipment rack enclosures are typically arranged in alternating hot and cold aisles, with the airflow direction from the cold to the hot aisle. Networking chassis with side-to-side or side-to-rear airflow are not compatible with the airflow created by the hot-and-cold aisle arrangement.

Side-to-side or side-to-rear airflow has cooling limitations within the networking chassis itself, in particular for high-performance switches that use optical lasers and/or other high power physical layer components. Cooling a large number of such high-power physical layer components with side-to-side airflow that is orthogonal to the layout of these components creates a significant air temperature rise that negatively affects the reliable operation of such components.

Cooling fans are generally the least reliable component in a networking chassis. Switches suitable for use in data center deployment typically must be continuously available, even if a fan has failed, and it is very desirable to be able to replace failed fans without affecting the network switch operation. It is very difficult if not impossible to provide hot-swappable redundant cooling in a switch chassis that uses side-by-side airflow.

Another problem is that two different orientations are used for mounting network switches in data center equipment racks. Conventionally network switches are installed with the networking ports facing to the front of the rack to allow for easy access to the network ports. However, if a network switch is deployed in the same rack as servers and the switch ports primarily connect to the server I/O ports, it is preferable to mount the switch such that the switch ports face to the rear of the rack since the server I/O ports are on the rear as well. This simplifies the cabling to the servers and minimizes the length of the cables required. Orientating the switch this way is sometimes referred to as "reverse mounting" in the sense that the front of the switch is now facing to the rear. Reverse mounting, however, necessitates a reversal of the airflow, i.e., the airflow direction for reverse mounting must go from the rear of the switch chassis to the front of the network switch chassis in order to be compatible with the airflow of the servers in the same rack. This ordinarily would require a different switch design in order to provide the appropriate airflow direction.

SUMMARY OF THE INVENTION

For all of the above reasons there is a need for an improved cooling system for a network switch chassis that overcomes existing problems in the art. Accordingly, the present invention provides a high-performance cooling system for a network switch chassis with multiple network ports and air openings on the front end of the chassis, and multiple fan modules (preferably more than two) on the back end of the chassis that provide redundant airflow and are hot-swap replaceable without interrupting the network switch operation. A mechanism for reverse airflow protection prevents recirculation of hot air while fan modules are replaced.

In addition, the fan modules can be configured such that the air flows either from the front to the back of the chassis, or alternatively from the back to the front of the chassis. Consequently, the same network switch chassis can be mounted in either forward or reverse direction in a rack.

In another aspect, the present invention provides an fan controller that includes the direction of the airflow in determining the setting of the fan speed in order to provide the appropriate amount of airflow for the two alternative airflow directions.

The advantages of the present invention are three-fold. First, the present invention provides a single network switch chassis that can be mounted in the front of the rack with front-to-rear airflow, or in the rear-of-the-rack with rear-to-front airflow, where front refers to the side of the switch that has the networking ports. Advantageously, this avoids the need for custom switch designs to allow front and rear mounting of switches in datacenter server racks. Second, the present invention provides for the network switch to control the fan module speeds to provide appropriate amount of airflow for either direction. Third, the present invention provides for hot-swap redundant fans, which allows fans to fail and to be replaced without interrupting the network switch operation.

DETAILED DESCRIPTION

This invention relates to the design of high-performance network switches to provide appropriate cooling. Aspects of the invention assist with combining the networking switch with server and storage units in an industry standard rack and to allow for cooling redundancy and the hot-swapping of fans without interrupting the operation of the networking switch.

Figure 1:
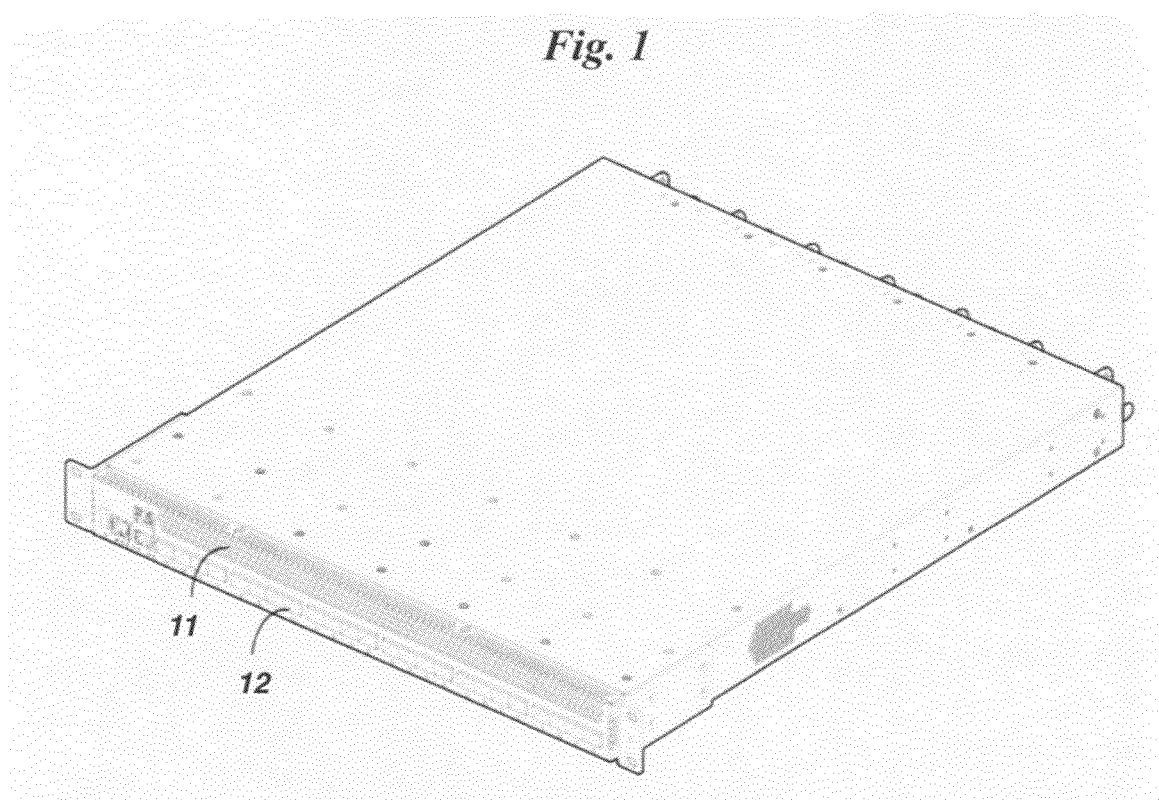
FIG. 1 is a perspective view of the front of a switch chassis according to an embodiment of the present invention.
Figure 2:
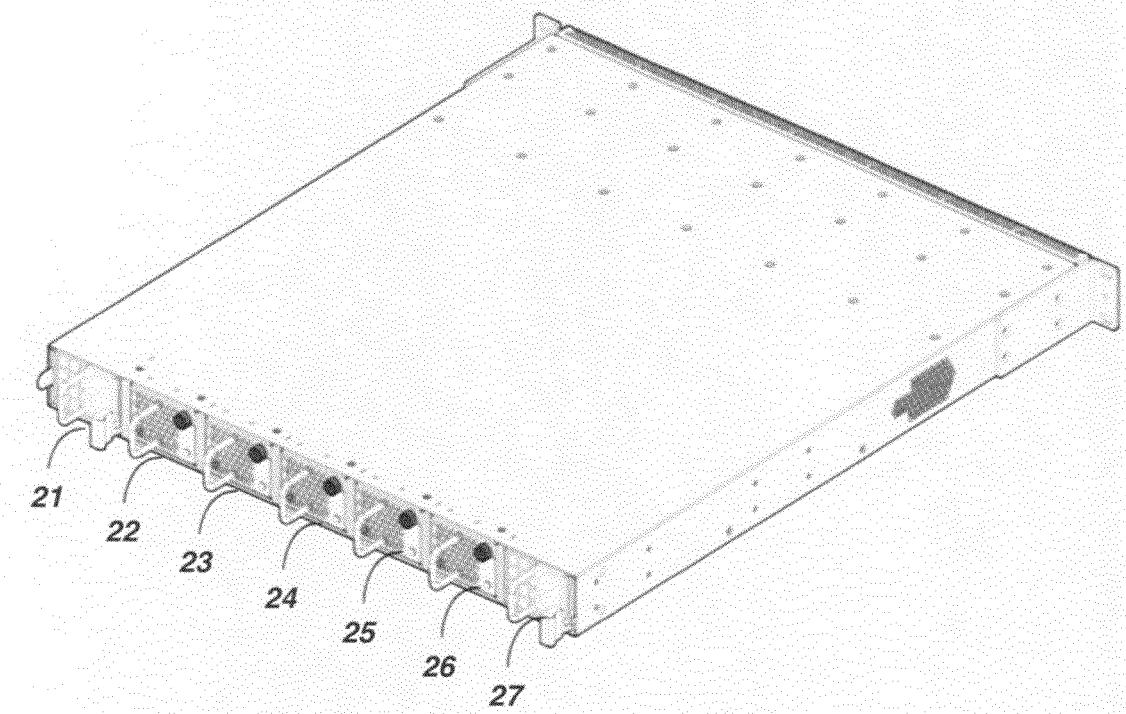
FIG. 2 is a perspective view of the rear of a switch chassis according to an embodiment of the present invention.

FIGS. 1 and 2 are perspective drawings of an example switch chassis according to an embodiment of the invention. FIG. 1 shows the front end of the chassis, FIG. 2 shows the rear end of the chassis. The switch chassis shown in FIGS. 1 and 2 is a IU rack mounted chassis that provides a 24-port 10 Gigabit Ethernet switch.

The example switch chassis is designed to fit into an industry-standard 19" rack with dimensions that are approximately 1.75" high, 17.5" wide, and 20" deep. The front of the chassis has air openings 11 located above the networking ports 12. Air openings 11 allow air to enter or exit the chassis. The rear of the chassis has five individually hot-swappable fan modules 22, 23, 24, 25, 26 located between the two hot-swappable power supplies 21, 27. The fan modules are hot-swappable, allowing replacement in the field without opening the switch chassis or interrupting the network switch operation.

Fan modules 21, 27 can be conveniently loaded with two types of fans. A Type 1 fan will pull air out of the chassis (from the front of the chassis out the rear). A Type 2 fan will push air into the chassis (from the rear of the chassis to the front). Therefore by loading the chassis with either Type1 or Type2 fan modules, both front-to-rear or rear-to-front airflow can be achieved with the same switch chassis.

All fan modules installed in the chassis must be of the same Type so that they induce the same airflow direction. To avoid the possibility of fan modules with different airflow directions getting installed in a given chassis, the airflow direction of the fan module is preferably electrically coded on the fan module connector. The system motherboard inside the chassis can detect the Type of each fan by reading the electrical code to verify that all fan modules loaded have the same orientation and move air the same direction.

Alternatively, dual-direction fan modules may have airflow direction switches that allow their airflow direction to be reversed. The switches may be manually operated or electronically controlled. These dual-direction fan modules may also have electronic codes to indicate their current airflow direction.

Figure 3:
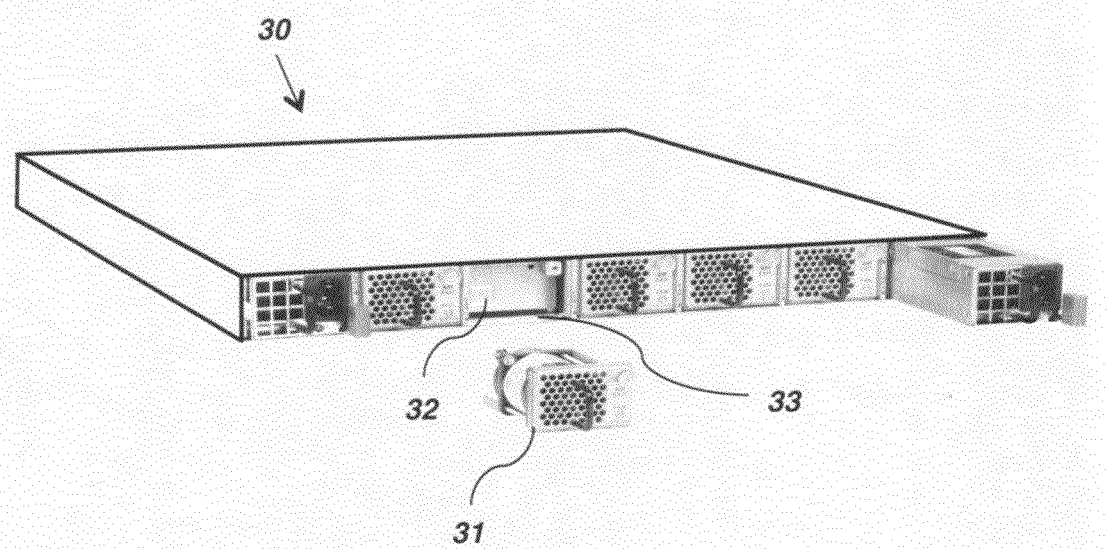
FIG. 3 is a perspective view of the reverse airflow inhibitor according to an embodiment of the present invention.

FIG. 3 shows a network switch chassis 30 with an airflow blocker associated with each fan module to prevent re-circulation of airflow. When fan module 31 is removed from chassis 30, a spring-loaded airflow blocker 32 closes air opening 33 in order to prevent the recirculation of hot air from the rear of the chassis back into the chassis, since the recirculation of air through opening 33 would have a detrimental affect on the proper cooling of the network switch chassis.

Figure 4:
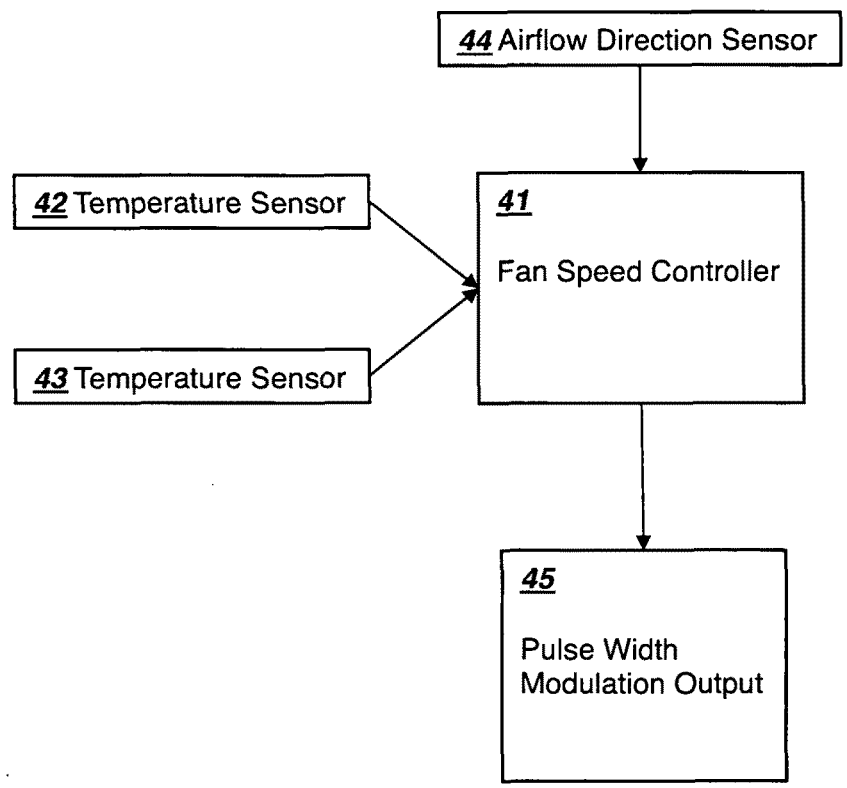
FIG. 4 is a schematic representation of the fan controller circuit that sets the speed of the fan modules according to an embodiment of the present invention.

FIG. 4 shows the logical components of fan speed controller circuitry according to one embodiment of the invention. The fan speed controller 41 senses the temperature reported by multiple temperature sensors 42 and 43. Controller 41 also senses an airflow direction through the chassis from airflow direction sensor 44. Fan speed controller 41 controls the actual fan speed by generating pulse width modulation (PWM) output 45. The fan speed controller 41 contains a profile that is used to compute the appropriate airflow speed based on the temperature inputs. Controller 41 is preferably loaded with two different profiles, one for the front-to-rear and another for rear-to-front airflow direction, respectively, to assure optimal cooling for both directions of airflow. The two profiles may be experimentally determined and then factory loaded. Preferably, the profiles are determined so that the fan speed in each direction provides just enough airflow at each temperature to provide the necessary cooling.

While the invention is susceptible to various modifications and alternative forms, specific embodiments are shown by way of example in the drawings and are herein described in detail. It should be understood, however, that drawings and detailed description thereto are not intended to limit the invention to the particular embodiment disclosed, but on the contrary, the invention is to cover all modifications, equivalents and alternatives falling within the spirit and scope of the present invention as defined by the appended claims.

The invention claimed is:

1. A network switch chassis comprising:
   a) air openings and network ports on a front end of the chassis,
   b) multiple hot-swap replaceable fan modules on a back end of the chassis,
   c) a fan speed controller configured with a first fixed profile for a first type of fan module having a first airflow direction and a second fixed profile for a second type of fan module having a second airflow direction, and
   wherein the controller is configured to detect and control each of the fan modules so they induce the same airflow direction using the first fixed profile to provide front-to-rear-airflow through the chassis if the first type of fan module is installed for each of the fan modules, and using the second fixed profile to provide rear-to-front airflow through the chassis if the second type of fan module is installed for each of the fan modules.

2. The network switch chassis of claim 1, wherein the controller determines an operational speed of the fan modules based on measured temperatures in the chassis, wherein the operational speed is determined using the first profile if the first type of fan module is installed and the second profile if the second type of fan module is installed.

3. The network switch chassis of claim 1, wherein airflow direction of each fan module is electrically coded on the respective fan module.

4. The network switch chassis of claim 1, further comprising circuitry configured to verify that all of the fan modules have the same airflow direction.

5. The network switch chassis of claim 3, further comprising circuitry configured to verify that all of the fan modules have the same airflow direction.

6. The network switch chassis of claim 1, wherein the controller is configured to sense the airflow direction.

7. The network switch chassis of claim 5, wherein the controller is configured to sense the airflow direction.

8. The network switch chassis of claim 1 further comprising at least one or more hot-swappable power supplies on the back end of the chassis.

* * * * *